United States Patent [19]

Mehlkopf et al.

[11] Patent Number: 5,414,359
[45] Date of Patent: May 9, 1995

[54] MAGNETIC RESONANCE IMAGING METHOD AND DEVICE FOR REDUCING IMAGE ERRORS IN A MAGNETIC RESONANCE IMAGE

[75] Inventors: Antoon F. Mehlkopf; Johannes H. Den Boef, both of Eindhoven, Netherlands

[73] Assignee: U.S. Philips Corporation, New York, N.Y.

[21] Appl. No.: 252,133

[22] Filed: May 31, 1994

Related U.S. Application Data

[63] Continuation of Ser. No. 823,918, Jan. 22, 1992, abandoned.

[30] Foreign Application Priority Data

Jan. 28, 1991 [NL] Netherlands ............... 9100138

[51] Int. Cl.6 ................................................. G01V 3/00
[52] U.S. Cl. ...................................... 324/309; 324/307
[58] Field of Search ............... 324/307, 309, 314, 318, 324/319, 320

[56] References Cited

U.S. PATENT DOCUMENTS

| | | | |
|---|---|---|---|
| 4,647,858 | 3/1987 | Bottomley | 324/320 |
| 4,928,063 | 5/1990 | Lampman et al. | 324/320 |
| 5,027,071 | 6/1991 | Hardy et al. | 324/309 |
| 5,157,330 | 10/1992 | Kaufman et al. | 324/320 |

OTHER PUBLICATIONS

Journal of Physics E. Scientific Instruments, Apr. (1987), No. 4, Bristol, U.K. pp. 416–419.
Journal of Physics E. Scientific Instruments, vol. 19, No. 10, Oct. 1986, pp. 871–875.

Primary Examiner—Louis Arana
Attorney, Agent, or Firm—Jack D. Slobod

[57] ABSTRACT

A magnetic resonance imaging method is known for the reduction of image errors in magnetic resonance images which are caused by quantization errors in a DAC (26) for generating a phase encoding gradient waveform in an MRI measuring sequence (ms1, ms2) for generating magnetic resonance signals (S(t), $S_1(t)$). The known method has the drawback that inter alia the effect of differential non-linearity of the DAC (26) on the image errors is not taken into account. The invention proposes an MRI method in which such image errors are also reduced. To achieve this, prior to and/or during application of the measuring sequences (ms1, ms2), deviations of phase encoding gradient areas relative to desired areas are determined and image data in an image matrix derived from the resonance signals are corrected on the basis of said deviations.

8 Claims, 5 Drawing Sheets

MAGNETIC RESONANCE IMAGING METHOD AND DEVICE FOR REDUCING IMAGE ERRORS IN A MAGNETIC RESONANCE IMAGE

This is a continuation of application Ser. No. 07/823,918, filed Jan. 22, 1992, now abandoned.

BACKGROUND OF THE INVENTION

1. Field of the Invention

The invention relates to a magnetic resonance imaging method for reducing image errors in a magnetic resonance image determined from magnetic resonance signals which are generated in an object by means of measuring sequences, which object is arranged in a uniform, steady magnetic field, the measuring sequences comprising a phase encoding gradient which is varied from one measuring sequence to another. The invention also relates to a magnetic resonance imaging device for reducing image errors in a magnetic resonance image, which device comprises means for generating a uniform, steady magnetic field, means for generating measuring sequences in order to generate magnetic resonance signals in an object arranged in the steady field, and means for reconstructing the magnetic resonance image from the resonance signals.

2. Description of the Related Art

A magnetic resonance imaging method and device of this kind are known from U.S. Pat. No. 4,713,615. The cited United States Patent Specification describes the formation of gradient waveforms of inter alia phase encoding gradients by applying data in digital form, under the control of a computer, to a digital-to-analog converter (DAC) and by subsequently applying the analog output signal of the digital-to-analog converter to a gradient amplifier, an output of which is coupled to a gradient coil. Due to quantization errors in the digital-to-analog converter, it is not possible to adjust any desired amplitude of the phase encoding gradient, i.e. the amplitude of the phase encoding gradient must be rounded off to the nearest DAC value. As is known, for phase encoding gradient waveforms the gradient area should approximate a desired value as well as possible. According to said United States Patent Specification, inaccuracy in respect of gradient area is reduced by applying, at a different instant within the measuring sequence and in addition to the phase encoding gradient with the described amplitude quantization, a further gradient of comparatively short duration whose gradient area equals the area error in the previously applied phase encoding gradient as well as possible. Furthermore, it is to be noted that the aim is for low-cost DACs, i.e. converters having a comparatively low resolution in combination with an optimum effective phase encoding gradient area. As an alternative it is described that, using a low-cost DAC, a gradient having a desired area can be obtained as well as possible by applying a two-pole gradient for all desired areas, which gradient switches between a maximum and a minimum value, the timing of an edge thereof being varied upon transition from the maximum to the minimum value.

The alternatives described in said United States Patent Specification are based on an ideal DAC, i.e. differential non-linearity which occurs in practical situations and which still gives rise to inaccuracies in the adjusted gradient amplitudes is not taken into account. This is important notably for the phase encoding gradient, especially in orthogonal MRI methods where MRI data in the k-space is to be situated on a cartesian grid. When the data is situated on a grid in the k-space, an image containing a minimum number of image errors will be obtained after inverse Fourier transformation of the data. In the low-cost/low-resolution DACs proposed in the cited United States Patent Specification such differential non-linearity will be greater than in more expensive high-resolution DACs, because DAC manufacturers do not impose unnecessarily severe requirements on their DAC design. Furthermore, the application of an additional gradient will not be desirable for all measuring sequences and notably in a so-called spin-warp measuring sequence it will lead to undesirable prolongation of the sequence duration. The use of a two-pole gradient is not always desirable either. Furthermore, DAC instability and non-linearity and instability and offset of the gradient amplifier will also give rise to image errors.

SUMMARY OF THE INVENTION

It is an object of the invention to provide a magnetic resonance imaging method of the kind set forth which produces a reduction of image errors for said image error sources and which does not impose a prolongation of the measuring sequence duration.

To achieve this, a magnetic resonance imaging method in accordance with the invention is characterized in that prior to and/or during application of the measuring sequence deviations of phase encoding gradient areas relative to desired area are determined, image data in an image matrix obtained from the resonance signals being corrected on the basis of said deviations. As a result, image errors in a magnetic resonance image are reduced, for example ghost images and blurring are reduced. Moreover, less accurate and hence less expensive gradient amplifiers can be used.

The invention is based on the observation of the fact that, despite the improvement of MRI equipment such as the use of shielded gradients, causing less eddy currents due to switching gradients, noticeable image errors still occur. Thus far it was usually assumed that the image errors were due mainly to eddy current influences. Not only image errors due to said image error sources are reduced, but residual errors due to eddy currents are also taken into account. All disturbances of desired phase encoding gradient area are corrected for. The invention is inter alia based on the idea that a fixed relationship exists between an adjusted phase encoding gradient and a generated magnetic resonance signal, so that in given circumstances the gradient area that has given rise to a resonance signal can be deduced from the relevant resonance signal. Correction is possible on the basis thereof. An actually non-equidistant signal sampling in the phase encoding gradient direction can be rendered equidistant by correction.

A version of a magnetic resonance imaging method in accordance with the invention is characterized in that, prior to application of the measuring sequences to the object, the deviations are determined, by applying, while varying the phase encoding gradient area, the measuring sequences to an object of known shape and composition, followed by storage in a look-up table, the phase encoding gradient being corrected for at least a predetermined period of time during application of the measuring sequences to the object, on the basis of correction values stored in the look-up table. For this version it is assumed that gradient deviations, caused inter alia by said differential non-linearity, are steady, i.e. constant at least for the duration of the measurement, but preferably for a much longer period of time. The object of known shape and composition, a so-called phantom, produces a known magnetic resonance signal, so that the phase encoding gradient area with which the signal has been generated can be deduced from the magnetic resonance signal. A deviation in the gradient area determined therefrom is stored in a look-up table, so that during the actual measurement on the object the desired gradient area can be adjusted by correction of the gradient. This is repeated for all phase encoding steps.

A version of a method in accordance with the invention, based on the assumption that the gradient deviations are steady, is characterized in that prior to application of the measuring sequences a further measuring sequence is applied to the object, the phase encoding gradient of said further measuring sequence serving as a read-out gradient and having an amplitude such that a sampling interval corresponds to a phase encoding step during application of the measuring sequences, the deviations during the measuring sequences being determined from the resonance signal obtained by means of the further measuring sequence and the resonance signals obtained by means of the measuring sequences. This version offers the advantage that no phantom is required, and utilizes the relation between the object to be measured and the phase encoding gradient. By reversal of the functions of phase encoding gradient and read-out gradient, an accurately adjustable sampling interval in "real" time is used for the determination of the adjustment inaccuracy in "pseudo"-time. During the actual measurement, on the basis thereof inaccuracy of adjustment of the phase encoding steps, pseudo-time, is determined and corrected for, for example by way of a linear interpolation such as a gridring method for inverse Fourier transformation.

A version of a magnetic resonance imaging method in accordance with the invention is characterized in that during application of the measuring sequences the deviations are determined on the basis of signal information from an object of known shape and composition arranged in a read-out gradient direction. It is thus achieved that the information of the object to be measured is frequency-separated from the object of known shape and composition (phantom). The area errors in the phase encoding gradient again become apparent as a non-equidistant sampling in pseudo-time. The frequency-separated information of the phantom is used to render the non-equidistant sampling equidistant.

A version of a magnetic resonance imaging method in accordance with the invention is characterized in that during application of the measuring sequences the deviations are determined on the basis of signal information from an object of known shape and composition which is arranged in the vicinity of the object to be measured, a local auxiliary field being superposed on the steady magnetic field at the area of the object of known shape and composition in order to achieve frequency separation between signal information from the object to be measured and signal information from the object of known shape and composition. The position of the phantom thus becomes independent of the read-out direction of the magnetic resonance signal. Frequency separation is provided by the local auxiliary field.

Another version of a magnetic resonance imaging method in accordance with the invention is characterized in that during application of the measuring sequences a magnetic field sensor which is sensitive to variations in the magnetic field due to the phase encoding gradient is used, at least during application of the phase encoding gradient, to measure the field for measuring sequences with successive phase encoding profiles, the deviations being determined on the basis of difference signals of the signals measured by means of the sensor. In comparison with the version involving a phantom in the read-out direction, this version again offers the advantage that no phantom is required in a given location. The sensor signal is a measure of the area of the phase encoding gradient and the difference signals are proportional to an increase of the area of the phase encoding gradient. It is to be noted that an accurate adjustment of the increase of the phase encoding gradient is important notably when ghost artefacts are concerned.

A version of a method in accordance with the invention is characterized in that the image data is corrected by means of a gridding method for Fourier inversion. When the deviations have been determined, the data matrix can be rendered orthogonal in the phase encoding direction, after which inverse Fourier transformation is performed to determine the magnetic resonance image.

An alternative version of a method in accordance with the invention is characterized in that a varying signal is superposed on a phase encoding gradient waveform during application of the measuring sequences. The effect of differential non-linearity in the DACs is reduced by a suitable choice of the varying signal, and at the same time a desired effective gradient area is obtained.

Another version of the alternative version in accordance with the invention is characterized in that the varying signal comprises a discrete noise-like pattern and/or a number of times a positive or negative signal amounting to at least one discretisation step of the digital-to-analog converter. The discrete noise-like pattern reduces the effect of the differential non-linearity of the DAC and the positive or negative discretisation steps ensure that the phase encoding gradient area approximates the desired area as well as possible. Depending on the actual situation, one of the latter steps could be dispensed with without substantially influencing the image error.

BRIEF DESCRIPTION OF THE DRAWING

The invention will be described in detail hereinafter with reference to a drawing; therein.

DETAILED DESCRIPTION OF THE PREFERRED EMBODIMENTS

Figure 1:
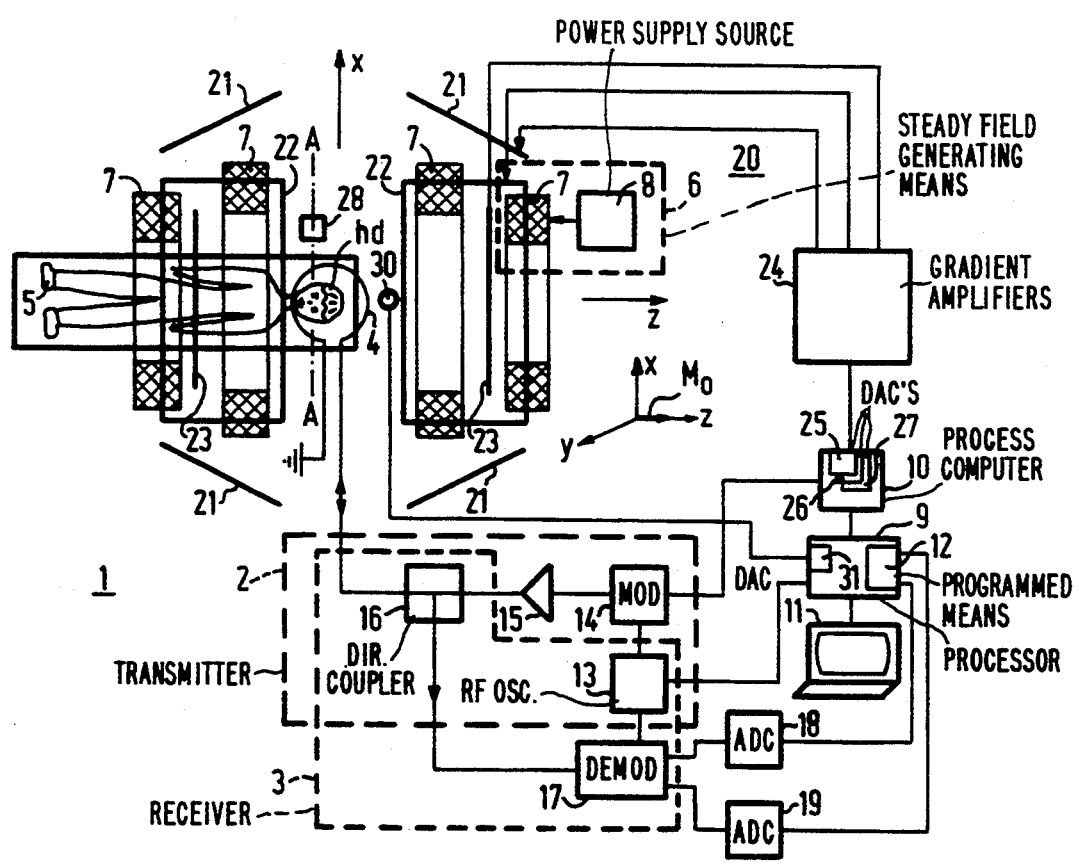
FIG. 1 shows diagrammatically a magnetic resonance imaging device in accordance with the invention.

FIG. 1 shows diagrammatically a magnetic resonance imaging device 1 in accordance with the invention, comprising transmitter 2 and receiver 3 for transmitting RF electromagnetic pulses to an object 5, via a transmitter/receiver coil 4 to an object 5 and for receiving magnetic resonance signals, respectively, which are generated by the RF electromagnetic pulses in the object 5, which is situated in a steady, uniform magnetic field. The transmitter/receiver coil 4 may be a single coil, but a separate transmitter coil and a separate receiver coil may be alternatively provided. The device 1 comprises means 6 for generating the steady field. The means 6 comprise magnet coils 7 and, in the case of resistive magnets or superconducting magnets, they also comprise a DC power supply source 8. In the case of a permanent magnet, the DC power supply source 8 can be omitted. During operation of the device 1, the object 5 being arranged within the magnet coils 7, a slight excess of nuclear spins (of nuclei having a magnetic moment) will be oriented in the same direction as the steady field in the state of equilibrium. From a macroscopic point of view this is to be considered as a magnetization $M_0$, being an equilibrium magnetization. The device 1 also comprises a processor 9 which is coupled to the transmitter means 2 and the receiver means 3, a process computer 10 which is coupled to the processing means 9 and the transmitter means, and display means 11 for displaying a nuclear magnetization distribution which is determined by the programmed means 12 from the resonance signals, received by the receiver 3 and demodulated after signal sampling thereof (detection of resonance signals). More specifically, the transmitter 2 comprises an RF oscillator 13 for generating a carrier signal, a modulator 14 for amplitude and/or phase and frequency modulation of the carrier signal, a power amplifier 15 and a directional coupler 16 which is coupled to the transmitter/receiver coil 4. The RF oscillator 13 is coupled to the processing means 9 and the modulator 14 is coupled to the process computer 10. When excitation pulses are applied to the object 5, under the control of the programmed means 12 and via the transmitter means 2, with a frequency contents in the vicinity of the so-called Larmor frequency of, for example protons, magnetic resonance signals will be produced wherefrom a proton nuclear spin distribution or a magnetic resonance image can be determined by the programmed means 12 by way of, for example, Fourier transformation. The receiver means 3 for receiving the resonance signals comprise the directional coupler 16 and a receiving and demodulation unit 17. The unit 17 may be a double phase-sensitive detector whose output signals are sampled by way of a first and a second analog-to-digital converter 18, 19, respectively. The A/D converters 18 and 19 are coupled to the processing means 9. The transmitter means 2 and the receiver means 3 can alternatively be formed by a so-called phase-coherent digital transmitter/receiver. The device 1 also comprises means 20 for generating magnetic field gradients which are superposed on the steady, uniform field. The means 20 comprise gradient magnet coils 21, 22 and 23 for generating magnetic field gradients $G_x$, $G_y$ and $G_z$, respectively, and a power supply source which can be controlled by the process computer 10 and which comprises gradient amplifiers 24 for powering the gradient magnet coils 21, 22 and 23 which are separately activatable. The process computer 10 comprises digital-to-analog converters (DACs) 25, 26 having, for example, the usual trapezoidal profile over time, and 27 for applying, via the supply of digital codes and under the control of the process computer 10, analog gradient waveforms to the gradient power supply system 24 whereby the respective gradients $G_x$, $G_y$ and $G_z$ are generated. For example, in the case of 2D-FT, $G_x$ is a measuring gradient, $G_y$ is a phase encoding gradient, and $G_z$, is a selection gradient. In the case of 3D-FT, $G_z$, may be a further phase encoding gradient. In the embodiment shown, the arrangement in space of the gradient magnet coils is such that the field direction of the magnetic field gradients coincides with the direction of the steady, uniform magnetic field and that the gradient directions extend perpendicularly to one another as indicated by three mutually perpendicular axes x, y and z in FIG. 1. The magnetic resonance signals wherefrom a nuclear spin distribution can be reconstructed by Fourier transformation are obtained by means of so-called measuring sequences.

Figure 2A:
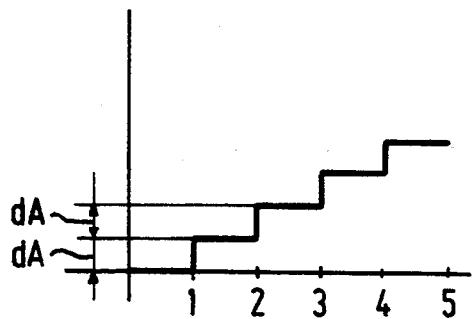
FIG. 2A shows a DAC characteristic of a linear DAC and FIG. 2B shows a DAC characteristic of a DAC exhibiting differential non-linearity.
Figure 2B:
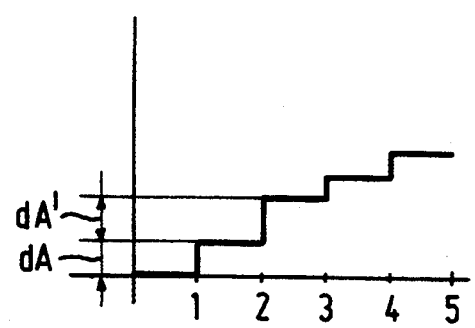

FIG. 2A shows a DAC characteristic of a linear DAC, a DAC output value being plotted as a function of a digital input value presented to an input of the DAC. The difference as regards output value is constant and equal to dA between two successive DAC input values. In practice this difference will usually not be constant, but so-called differential non-linearity will occur. The DACs 25, 26 and 27 shown in FIG. 1 will generally also exhibit differential non-linearity. FIG. 2B shows a DAC characteristic with differential non-linearity, i.e. the difference as regards output value of the DAC is not constant between successive DAC input values, as designated by dA and dA′ in FIG. 2A. Inter alia such differential non-linearity causes non-equidistant sampling in the phase encoding direction or in pseudo-time, thus causing image errors (artefacts) in an image reconstructed from magnetic resonance signals.

Figure 3:
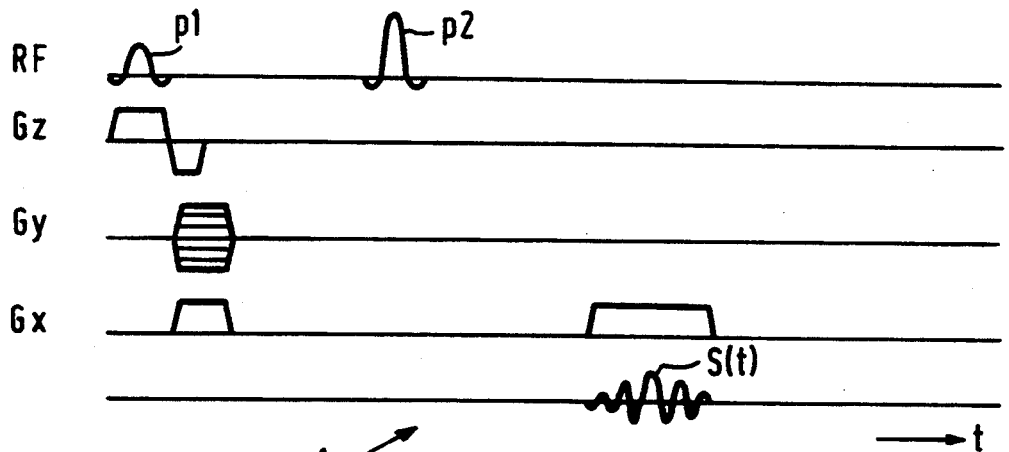
FIG. 3 shows a spin-echo MRI measuring sequence.

FIG. 3 shows a spin-echo MRI measuring sequence ms1 as a function of time t which can be used in versions of a method in accordance with the invention. The spin-echo measuring sequence ms1 comprises respective RF electromagnetic pulses p 1 and p2 which are applied to the object 5 by the transmitter means 2 in order to excite nuclear spins in the object 5, thus generating a magnetic resonance signal S(t) which is detected by the receiver means 3 and which is processed in the processing means 9. The measuring sequence rest furthermore comprises, in the case of so-called 2D-FT imaging, a slice-selective gradient $G_z$ which is generated by the means 20 in order to select a slice of the object 5, for example in order to obtain an MRI cross-section of a head hd of the object 5 along the line A—A as shown in FIG. 1. In order to encode nuclear spins in the slice so that a spatial nuclear spin distribution in the slice can be obtained, a phase encoding gradient $G_y$ and a read-out gradient $G_x$ are applied. Repetition of the measuring sequence ms1 while varying the amplitude of the phase encoding gradient $G_y$ produces samples in the so-called pseudo-time (the sequence is repeated, for example 256 times for different phase encoding gradient amplitudes). Furthermore, each signal S(t) is sampled by means of the analog converters 18 and 19 (for example, 256 signal samples). The programmed means 12 included in the processing means 9 determine, by way of an inverse Fourier transformation, a magnetic resonance image from a matrix of samples (256×256). For a further description of a spin-echo measuring sequence and other feasible sequences reference is made to the book "*Practical NMR Imaging*", M. A. Foster and J. M. S. Hutchinson, IRL Press, 1987, ISBN 1-85221-011-7, notably to chapter 6, pp. 145–171. For a description of MRI measuring sequences in terms of the so-called k-space, reference is made to chapter 1, section 4.4, pp. 8–22 of said book which describes general principles of Fourier imaging.

Figure 4:
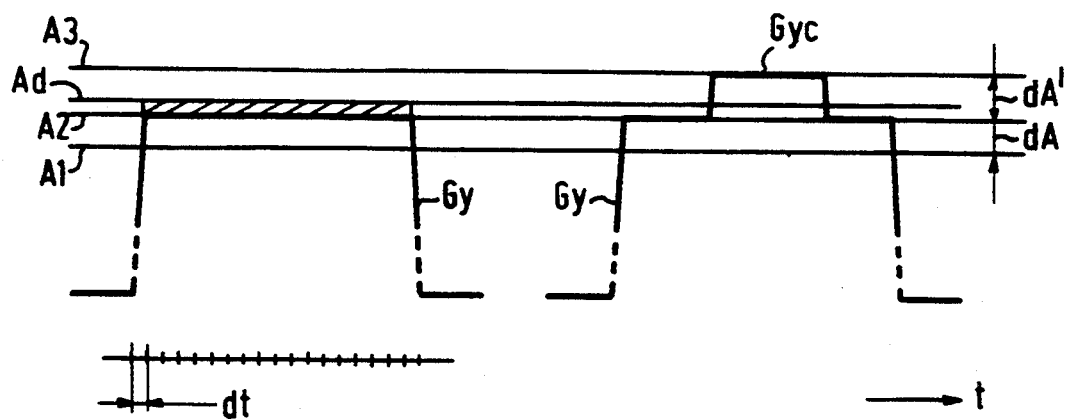
FIG. 4 shows a phase encoding gradient and a corrected phase encoding gradient in accordance with the invention.

FIG. 4 shows a phase encoding gradient $G_y$ which is suitable for use in a measuring sequence as described with reference to FIG. 3. In the device 1 the gradient $G_y$ is formed by presenting digital input values to the digital-to-analog converter 26 under the control of the programmed means 12. A gradient waveform is realised by presenting input values a number of times with sampling intervals dt. In the case of Fourier imaging, the same input value will be presented to the digital-to-analog converter 26 during a given period of time, i.e. a gradient of constant amplitude is generated. Due to the finite discretisation of the digital-to-analog converter 26, the desired amplitude Ad will be rounded off to a neighbouring DAC value in practical cases, i.e. to the amplitude A2 in the present example. Also indicated are amplitudes A1 and A3 and also amplitude differences dA and dA′ between successive DAC values in order to indicate said differential non-linearity of the DAC in respect of the phase encoding gradient $G_y$. The difference between the desired amplitude Ad and the adjusted amplitude A2 is denoted by shading and represents an error area of the phase encoding gradient $G_y$ during its application. The error areas over the various amplitudes of the phase encoding gradient $G_y$ are unknown because the variation of the differential nonlinearity of the DAC is not known and may fluctuate in time, for example due to temperature effects. In a first version of a method in accordance with the invention it is assumed that amplitude errors in the phase encoding gradient $G_y$ are steady. In this version the measuring sequence ms1 is applied, prior to the actual measurement of the object 5, to a phantom 28 arranged in the device 1. The measuring sequence ms1 is repeated while varying the amplitude of the phase encoding gradient $G_y$. The signal can then be generated in the entire phantom 28, i.e. the slice selection gradient $G_z$ may be omitted. The position of the phantom 28 is not critical as long as it is ensured that the phantom 28 is excited. Because a fixed relationship exists between an MRI signal and an adjusted $G_y$ value and measurement is performed on an object of known shape and composition (phantom), the gradient area having caused the MRI signal can be deduced from the measured MRI signal. By applying such a correction to the phase encoding gradient $G_y$ that the received and detected signal is equal to the signal to be expected from the known object and by applying this correction also during the actual measurement, correction is possible inter alia for differential non-linearity. By repeating this process for all gradient values, as if it were a non-equidistant sampling in pseudo-time is rendered equidistant again, so that a reduction of image errors occurs after image reconstruction from the samples of the object 5 to be measured. The correction is indicated for one gradient value and implies that a modified digital input value is presented to the digital-to-analog converter 26 during a number of samples dt. If necessary, the correction value can be iteratively determined. The correction values $G_{yc}$ can be stored in a so-called look-up table in the programmed means 12 in order to be fetched again during the actual measurement so as to be applied to the phase encoding gradient $G_y$. When the gradient deviation is steady, the correction can be applied a large number of times.

In other versions of a method in accordance with the invention, where the gradient deviation is not steady, the phantom is introduced into the device 1 during the actual measurement and the phantom is also measured.

Figure 5A:
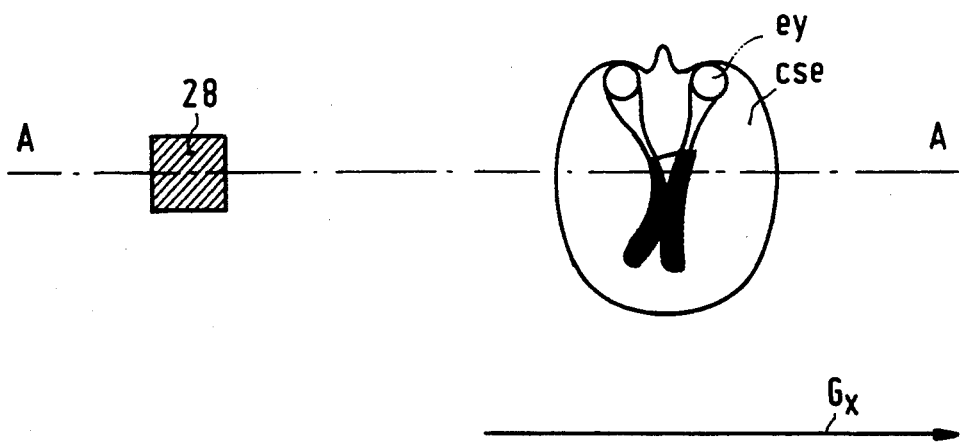
FIGS. 5A and 5B show the positioning of a phantom with respect to a cross-section of an object to be measured in various versions of a method in accordance with the invention.

FIG. 5A shows the positioning of a phantom 28 with respect to a slice cse of the head hd of the object 5, the phantom being arranged along a line A—A in the direction of the read-out gradient $G_x$ of the slice cse. The slice cse in the present example offers a transverse MRI image of the head hd of the object at the area of the eyes ey thereof. This method of positioning ensures that the information in the MRI signal of the known object, i.e. a phantom 28, is frequency-separated from information of the object 5 to be measured, being a slice cse having a thickness of a few mm in the present example. The information of the known object is again used to correct for non-equidistant sampling in pseudo-time. For correction use can be made of a gridding method which renders the non-equidistant sampling equidistant on the basis of the information of the phantom 28, so that a magnetic resonance image containing fewer image errors is obtained after reconstruction. Such a gridding method is described in the article "A Fast Sinc Function Gridding Algorithm for Fourier Inversion in Computer Tomography", J. D. O'Sullivan, *IEEE Transactions on Medical Imaging*, Vol. MI-4, No. 4, December 1985, pp. 200–207.

Figure 5B:
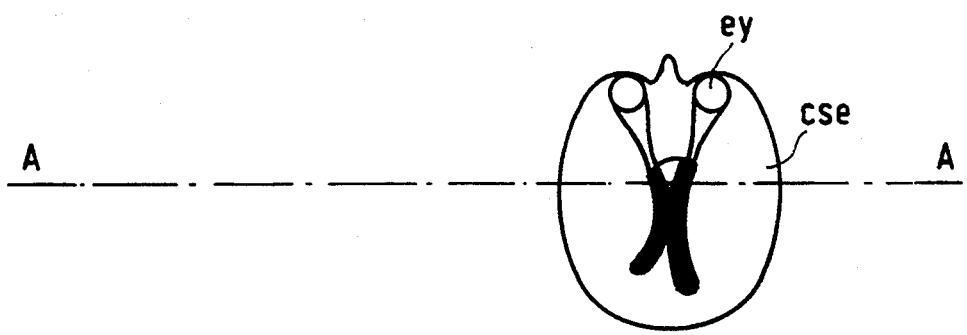
Figure 5B:
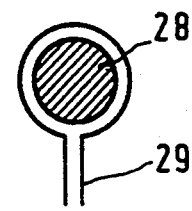

FIG. 5B shows a different position of a phantom 28 with respect to a cross-section cse of the object 5. In this case the phantom 28 occupies a fixed position in the device 1, which is handier in a clinical environment in which the MRI device 1 is used. The preferably spherical phantom 28 is now enclosed by a coil 29 which generates a local, uniform auxiliary field in the phantom 28, which auxiliary field is superposed on the steady, uniform magnetic field generated by the means 6. The local auxiliary field achieves frequency separation between information of the phantom 28 and the object 5, regardless of the read-out gradient direction $G_x$. The current intensity through the auxiliary coil 29 is to be suitably chosen in order to ensure that phantom signals remain within the bandwidth of the receiver means 3.

In another version of a method in accordance with the invention, in which the use of a phantom is avoided, a magnetic field sensor 30 is arranged in the device 1 in a stationary position. The sensor 30, being sensitive to field variations due to the phase encoding gradient $G_y$, is connected to the processing means 9. The sensor information is applied to the programmed means 12. During application of the measuring sequence ms1, the sensor signal is sampled by way of an analog-to-digital converter 31 as from the instant at which the phase encoding gradient $G_y$ is switched on and for at least the duration of the phase encoding gradient $G_y$. As a result, a measure of the area of the phase encoding gradient $G_y$ is obtained. When sampling is continued slightly longer than necessary to obtain this measure, the advantage is obtained that eddy current effects are also taken into account. By subtraction of the signals obtained by the sensor for successive $G_y$ profiles, values $\Delta K_y$ are obtained in the k-space. This again expresses non-equidistant sampling in the phase encoding direction. Said gridding method or another suitable interpolation method can again be used to correct the image artefacts.

Another version of a method in accordance with the invention which does not require the use of a phantom and which is based on the assumption that the gradient deviations are steady will be described with reference to the FIGS. 6A to 6D.

Figure 6A:
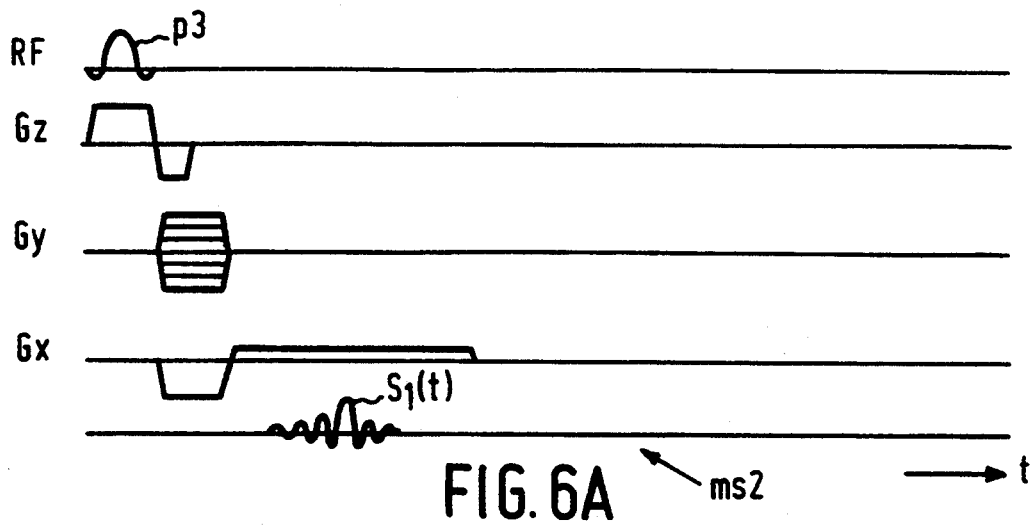
FIGS. 6A and 6B show measuring sequences in a version in accordance with the invention and FIGS. 6C and 6D show associated samples in the k-space.
Figure 6B:
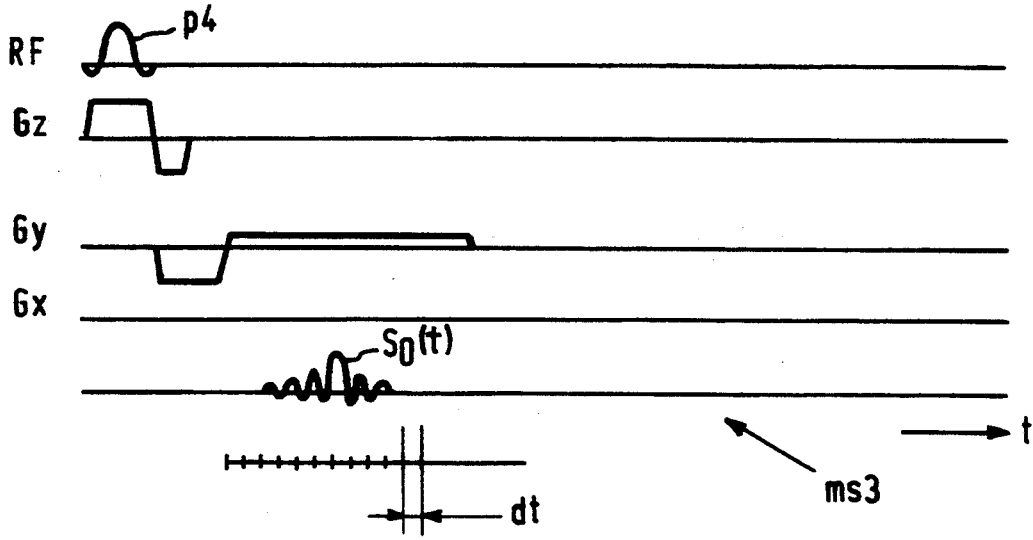
Figures 6C, 6D:
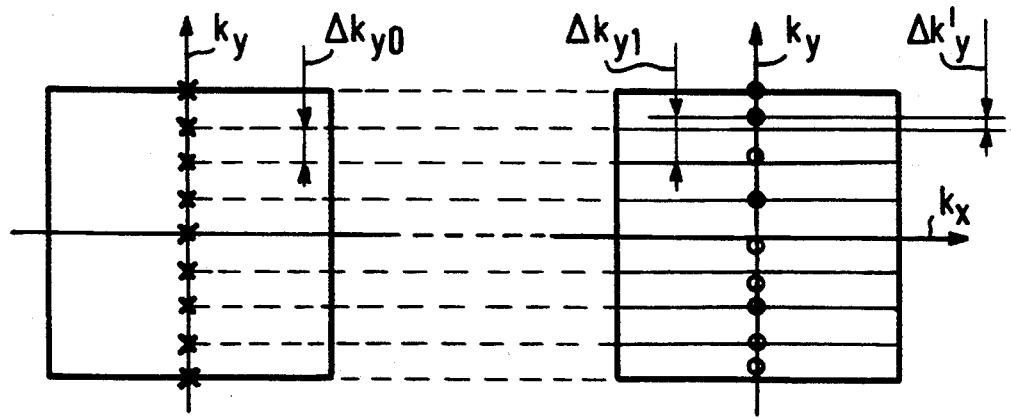

FIG. 6A shows a known so-called spin-warp MRI measuring sequence ms2 which comprises an RF electromagnetic pulse p3 and also a slice-selective gradient $G_z$, a phase encoding gradient $G_y$ and a read-out gradient $G_x$. Via the measuring sequence ms2, magnetic resonance signals $S_1(t)$ are generated in the object 5. The measuring sequence ms2 is repeated a number of times while varying the amplitude of the phase encoding gradient $G_y$. For a further description of the spin-warp sequence reference is made to said book by Foster and Hutchinson, pp. 18–22. Prior to the application of the measuring sequence ms2, a further measuring sequence ms3 is applied to the object 5 as shown in FIG. 6B, which further measuring sequence comprises an RF electromagnetic pulse p4, $G_y$ therein acting as a read-out gradient instead of $G_x$. During application of the measuring sequence ms3, the gradient $G_x$ in principle remains switched off. The amplitude of the gradient $G_y$ during the read-out of a magnetic resonance signal $S_0(t)$ to be obtained by way of the measuring sequence ms3 is chosen so that a sampling interval dt for the read-out of the signal $S_0(t)$ corresponds to a step in pseudo-time during application of the measuring sequence ms2, i.e.

$$\int G_y \cdot \Delta t = \Delta k_y$$

where $\Delta k_y$ in the k-space corresponds to a sampling step dt of the measuring sequence ms3. In this version use is made of the fact that the sampling in time is accurately adjustable and, through interchanging of the functions of $G_y$ and $G_x$ during application of the preparatory measuring sequence ms3, substantially equidistant sampling in pseudo-time is obtained which serves as a reference for correction of the non-equidistant sampling in pseudo-time during application of the actual measuring sequence ms2. It is to be noted that the further measuring sequence ms3 may otherwise be set up as the measuring sequence ms2, i.e. the resonance signal $S_0(t)$ originates from the same slice. The equidistant sampling in the k-space is denoted by symbols "x" for the measuring sequence ms3 in FIG. 6C, the non-equidistant sampling in the k-space being denoted for the measuring sequence ms2 in FIG. 6D by symbols "o". FIG. 6D shows that a sampling error $\Delta k_y' = \Delta k_{y0} - \Delta k_{y1}$ arises in the k-space. The sampling errors in pseudo-time can be determined by fetching, during application of the measuring sequence ms2, the corresponding samples in the k-space of the measuring sequence ms3 for each $G_y$ profile. The data matrix can be rendered orthogonal by linear interpolation, for example using said gridding method.

Figure 7:
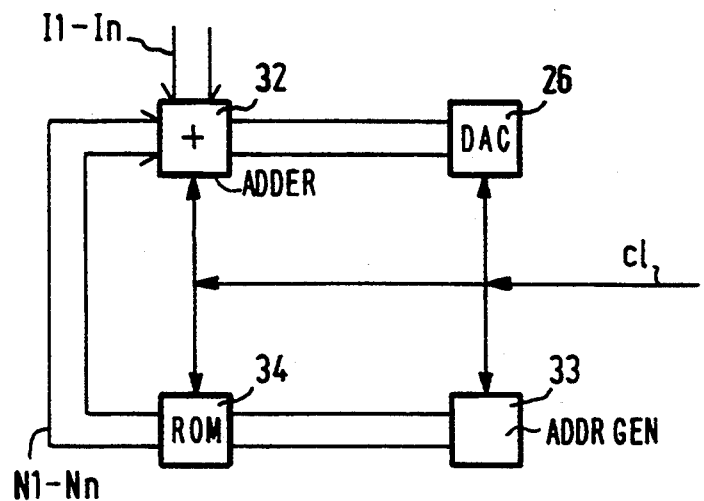
FIG. 7 shows a modification of the device shown in FIG. 1 in order to implement an alternative version of a method in accordance with the invention.

FIG. 7 shows a modification of the device 1 of FIG. 1 in order to implement an alternative version of a method in accordance with the invention. In comparison with a customary MRI device 1, the process computer 10 has been modified in a sense that the DAC 26 does not correctly receive the digital input values I1-In, where for example n=16, for forming $G_y$ from the programmed means 12; instead a varying signal is superposed on the gradient waveform. The varying signal may be a noise-like digital pattern having a mean value zero. The signal amplitudes may vary arbitrarily over different discretisation steps of the DAC. The effect of differential non-linearity of He DAC 26 is thus reduced, resulting in a reduction of image errors. The modification involves an adder 32, a first input of which receives the digital input values and a second input of which receives the noise-like digital pattern N1–Nn. The noise-like digital pattern N1–Nn can be provided by a ROM (read-only memory) 34 filled with the digital noise pattern and controlled by an address generator 33. The DAC 26, the adder 32, the address generator 33 and the ROM are clocked by means of a clock signal cl. For a phase encoding gradient $G_y$ having a duration of 1 ms and a clock signal cl having a clock period amounting to 10 μs, the noise pattern then contains 100 values. Alternatively, the additional hardware 32, 33 and 34 can be omitted. In that case the noise-like pattern is generated in the programmed means 12 which then have to satisfy more severe requirements.

Figure 8:
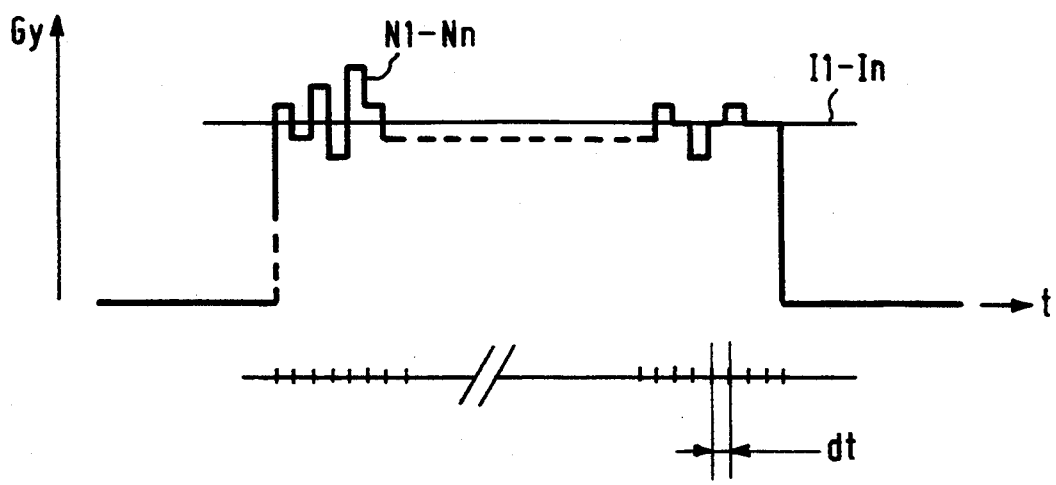
FIG. 8 shows a phase encoding gradient generated by means of the modified device.

FIG. 8 shows a phase encoding gradient $G_y$ as a function the time t, said gradient having been generated by means of the modified device 1. When constant input values I1–In are presented, the noise-like pattern will vary by some step sizes of the DAC 26 around said constant value, its mean value being zero. The clock frequency of the clock signal cl is then 1/fit. Instead of a noise-like pattern, the ROM 34 can also store a signal which varies as a function of the clock signal and which alternately comprises positive and negative amplitudes around the desired gradient amplitude, for example with a cosine envelope. In order to achieve an improvement by a factor 10 of the mean deviation due to the differential non-linearity of the DAC, a ROM length of 100 is then required. Gradient forms other than constant forms can also be presented, be it that it is then more difficult to achieve orthogonality. As a result of the introduction of the noise pattern, a DAC 26 having a differential non-linearity is effectively linearized. Because of the inherent discretisation of a DAC, it is not possible to obtain all desired values during Fourier imaging when constant input values I1–In are presented during application of a (phase encoding) gradient. The discretisation of the DACs 25, 26 and 27 is then decisive rather than the usually finer discretisation of the programmed means 12. In order to mitigate this drawback, the programmed means 12 can, at least during a given part of the duration of application of the gradient, add or subtract a value equal to, for example a discretisation step dA of the DAC linearized by the noise-like pattern to or from a desired value of the gradient amplitude rounded off to a feasible digital input value for the DAC. The desired gradient area is approximated as well as possible by this so-called serration mechanism in combination with the application of the noise-like pattern. The absolute error is then smaller than dA*dt/2. The shorter the sampling period dt relative to the duration of the gradient, the more accurate the serration mechanism will be.

The digital pattern in the ROM 34 is preferably chosen so that the Fourier transform of the gradient noise is outside the bandwidth of the analog gradient channel (gradient amplifier and gradient coil). The programmed means can generate noise in the frequency domain and can generate gradient noise by inverse Fourier transformation of the generated noise.

The above versions have been described for one phase encoding gradient. The described methods can also be used when the measuring sequences comprise more than one phase encoding gradient, for example as in the case of 3D-FT involving two phase encoding gradients. The methods can then be used for both phase encoding gradients. Furthermore, the methods described for non-steady gradient deviations can also be used in the event of steady gradient deviations.

Furthermore, the DACs 25, 26 and 27 can be omitted in a magnetic resonance imaging device 1 comprising switching gradient amplifiers, for example a pulse-width or pulse-density modulated gradient amplifier such as supplied inter alia by the firms Copley and Analogic. The method in accordance with the invention can also be used in such a magnetic resonance imaging device 1.

What is claimed is:

1. A magnetic resonance imaging method for reducing image errors in a magnetic resonance image due to nonlinearity between actual phase encoding gradient areas produced in gradient coil control signals in response to input phase encoding profiles and the integral of the input phase encoding profiles over time, said magnetic resonance image being determined from magnetic resonance signals which are generated in an object under examination by means of successive measuring sequences, which object is situated in a uniform, steady magnetic field, said method comprising:

applying the successive measuring sequences, each of said measuring sequences including a phase encoding gradient whose area over time is varied by phase encoding steps from one measuring sequence to another in response to the input phase encoding profiles;

prior to or during application of the measuring sequences, determining deviations of actual phase encoding gradient areas produced in gradient coil control signals relative to integrals over time of the phase encoding profiles; and obtaining a k-space data matrix from the magnetic resonance signals which k-space data matrix contains k-space data that has been corrected on the basis of said deviations.

2. A magnetic resonance imaging method as claimed in claim 1, wherein, prior to the application of the measuring sequences to the object, the deviations are determined by applying the measuring sequences to an object of known shape and composition, while varying the phase encoding gradient areas in phase encoding steps, followed by storage of correction values in a look-up table, the phase encoding profiles being corrected, for at least a predetermined period of time during application of the measuring sequences to the object under examination, on the basis of the correction values stored in the look-up table.

3. A magnetic resonance imaging method as claimed in claim 1, wherein, prior to the application of the measuring sequences a further measuring sequence is applied to the object under examination, the phase encoding gradient of said measuring sequences serving as a read-out gradient applied over a plurality of sampling intervals in said further measuring sequence and having an amplitude such that the sampling intervals correspond to respective phase encoding steps during application of the measuring sequences being determined from the magnetic resonance signal obtained by means of the further measuring sequence and the magnetic resonance signals obtained by means of the measuring sequences.

4. A magnetic resonance imaging method as claimed in claim 1, wherein during application of the measuring sequences the deviations are determined on the basis of signal information from an object of known shape and composition arranged in a read-out gradient direction.

5. A magnetic resonance imaging method as claimed in claim 1, wherein during application of the measuring sequences the deviations are determined on the basis of signal information from an object of known shape and composition which is arranged in the vicinity of the object under examination, a local auxiliary field being superposed on the steady magnetic field at the areas of the further object in order to achieve frequency separation between signal information from the object under examination and signal information from the object of known shape and composition.

6. A magnetic resonance imaging method as claimed in claim 1, wherein during application of the measuring sequences a magnetic field sensor which is sensitive to variations in magnetic field due to the phase encoding gradient is used, at least during application of the phase encoding gradient to measure the field for measuring sequences with successive phase encoding profiles, the deviations being determined on the basis of difference signals of the signals measured by means of the sensor.

7. A magnetic resonance imaging method as claimed in any one of the claims 3 to 6, wherein the k-space data has been corrected by means of a gridding method for Fourier inversion.

8. A magnetic resonance imaging device for reducing image errors in a magnetic resonance image due to nonlinearity between actual phase encoding gradient areas in phase encoding gradient coil control signals, produced in response to input phase encoding profiles, and the integral of the input phase encoding profiles over time, which device comprises means for generating a uniform, steady magnetic field, coil means for superimposing controllable gradient magnetic fields on said uniform, steady magnetic field in response to control signals including said phase encoding gradient coil control signals, means for generating measuring sequences in order to generate magnetic resonance signals in an object under examination arranged in the steady field, and means for reconstructing the magnetic resonance image from the resonance signals, wherein the means for generating the measuring sequences also comprises means for determining, prior to or during application of the measuring sequences comprising different phase encoding areas in response to respective input gradient profiles, deviations of actual phase encoding gradient areas relative to integrals of the gradient profiles over time and for obtaining, on the basis thereof, a k-space data matrix of corrected k-space data.

* * * * *